United States Patent
Su et al.

(10) Patent No.: US 11,810,786 B2
(45) Date of Patent: Nov. 7, 2023

(54) METHOD FOR FABRICATING SEMICONDUCTOR DEVICE

(71) Applicant: UNITED MICROELECTRONICS CORP., Hsinchu (TW)

(72) Inventors: Po-Wen Su, Kaohsiung (TW); Cheng-Han Lu, Chiayi (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 269 days.

(21) Appl. No.: 17/385,969

(22) Filed: Jul. 27, 2021

(65) Prior Publication Data

US 2022/0415647 A1    Dec. 29, 2022

(30) Foreign Application Priority Data

Jun. 29, 2021 (CN) .......................... 202110724797.X

(51) Int. Cl.
| | |
|---|---|
| *H01L 21/027* | (2006.01) |
| *H01L 21/768* | (2006.01) |
| *H01L 21/3213* | (2006.01) |
| *H01L 21/033* | (2006.01) |
| *H01L 21/311* | (2006.01) |
| *H01L 21/308* | (2006.01) |

(52) U.S. Cl.
CPC ...... *H01L 21/0274* (2013.01); *H01L 21/0337* (2013.01); *H01L 21/3086* (2013.01); *H01L 21/31144* (2013.01); *H01L 21/32139* (2013.01); *H01L 21/76816* (2013.01); *H01L 21/76892* (2013.01)

(58) Field of Classification Search
CPC ............ H01L 21/0274; H01L 21/0337; H01L 21/3086; H01L 21/31144; H01L 21/32139; H01L 21/76816; H01L 21/76892; H01L 21/76229; H01L 29/0649; H01L 21/76224
USPC ......................................................... 438/703
See application file for complete search history.

(56) References Cited

U.S. PATENT DOCUMENTS

| | | | |
|---|---|---|---|
| 6,475,891 B2 | 11/2002 | Moon | |
| 7,531,456 B2 | 5/2009 | Kwon et al. | |
| 2017/0004996 A1* | 1/2017 | Briggs | .............. H01L 21/76802 |

* cited by examiner

*Primary Examiner* — Caleen O Sullivan
(74) *Attorney, Agent, or Firm* — WPAT, P.C

(57) ABSTRACT

A method for fabricating a semiconductor device includes following steps: A patterned mask layer including a plurality of standing walls and a covering part is formed on a surface of a semiconductor substrate, wherein two adjacent standing walls define a first opening exposing a part of the surface, and the covering part blankets the surface. A first patterned photoresist layer is formed to partially cover the covering part. A first etching process is performed to form a first trench in the substrate, passing through the surface and aligning with the first opening. A portion of the patterned mask layer is removed to form a second opening exposing another portion of the surface. A second etching process is performed to form a second trench in the substrate and define an active area on the surface. The depth of the first trench is greater than that of the second trench.

10 Claims, 13 Drawing Sheets

METHOD FOR FABRICATING SEMICONDUCTOR DEVICE

This application claims the benefit of People's Republic of China application Serial No. 202110724797.X, filed Jun. 29, 2021, the subject matter of which is incorporated herein by reference.

BACKGROUND

Technical Field

The disclosure relates to a method for fabricating an integrated circuit structure, and more particularly to a method for fabricating a semiconductor device.

Description of Background

A typical integrated circuit (IC) structure needs to maintain a sufficiently wide (generally more than 100 microns) pitch between a low-voltage region and a high-voltage region to make the IC structure withstanding a large voltage drop and maintain its normal performance and electronic properties. However, as the semiconductor devices involved in the IC structure become more and more dense, the critical size of the semiconductor devices becomes smaller and smaller. The current pitch requirement limits the shrinkage in the critical dimension of the IC structure. In order to solve this problem, the prior art has proposed a deep trench isolation structure to isolate different regions of the semiconductor substrate and reduce the critical dimension of the IC structure. But, in addition to the deep trench isolation structure between the low-voltage region and the high-voltage region, there are also a shallow trench isolation (STI) structure configured between the semiconductor devices in each region, which makes the manufacturing process of the IC structure more complicated. How to form these two kinds of trench structures with different depths in a semiconductor substrate with fewer manufacturing process steps to improve the manufacturing process efficiency of the IC structures has become an important subject for those with ordinary knowledge in the art.

Therefore, there is a need of providing an advanced method for fabricating a semiconductor device to obviate the drawbacks encountered from the prior art.

SUMMARY

One aspect of the present disclosure is to provide a method for fabricating a semiconductor device, wherein the method includes steps as follows: A patterned mask layer including a plurality of standing walls and at least one covering part is formed on a surface of a semiconductor substrate, wherein at least two adjacent ones of the plurality of standing walls define a first opening to expose a portion of the surface, and the at least one covering part blankets over the surface. A first patterned photoresist layer is then formed to at least partially cover the at least one covering part. A first etching process is performed to form at least one first trench in the substrate, passing through the surface and aligning with the at least one first opening. A portion of the patterned mask layer is removed to form at least one second opening exposing another portion of the surface. A second etching process is performed to form at least one second trench in the semiconductor substrate and define an active area on the surface, wherein the at least one first trench has a depth greater than that of the at least one second trench.

In accordance with the aforementioned embodiments of the present disclosure, a method for fabricating a semiconductor device is provided. A patterned sacrificial layer having at least one mandrel unit is used to form a patterned mask layer with a three-dimensional (3D) opening structure on the surface of a semiconductor substrate. An etching process using the patterned mask layer as an etching mask is then performed to etch the surface of the semiconductor substrate. Thereinafter, another photoresist photolithography etching process is performed thereon to form two types of self-aligned trench structures with different depths in the semiconductor substrate, and at least one active region can be defined on the surface of the semiconductor substrate for subsequently forming semiconductor units thereon. Thereby, the processing steps and complexity for forming the semiconductor device can be greatly reduced, and the yield and efficiency for manufacturing the same can be significantly improved.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1:
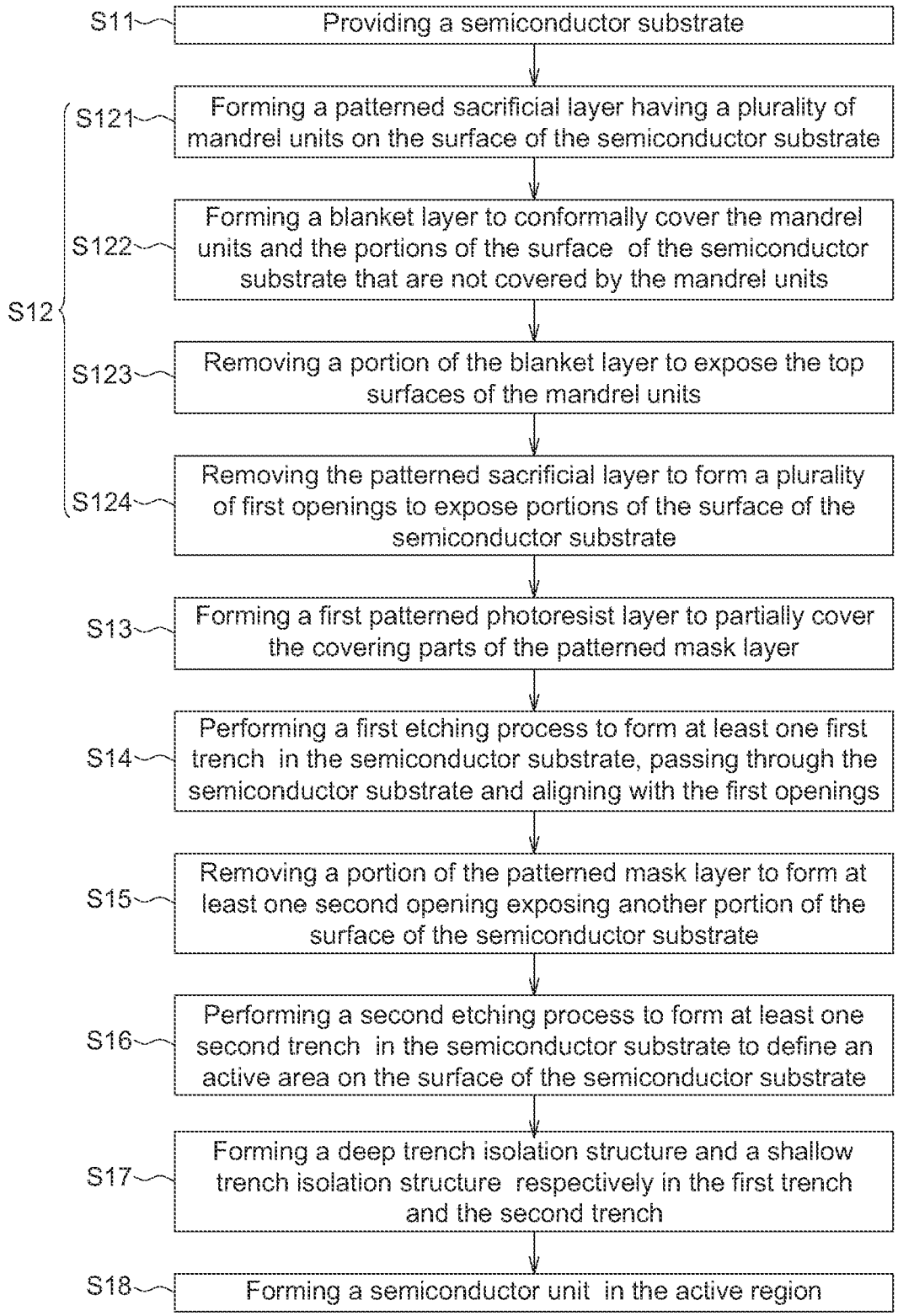
FIG. 1 is a processing flowchart illustrating a method for fabricating a semiconductor device, in accordance with one embodiment of the present disclosure.

The embodiments as illustrated below provide a method for fabricating a semiconductor device to improve the processing yield and efficiency for manufacturing the semiconductor device. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIG. 1 is a processing flowchart illustrating a method for fabricating a semiconductor device 100, in accordance with one embodiment of the present disclosure; and FIGS. 2A to 2L are cross-sectional views illustrating a series of processing structures for fabricating the semiconductor device 100 according to the method as described in FIG. 1.

The method for fabricating a semiconductor device 100 includes steps as follows: First, referring to step S11: a semiconductor substrate 101 is provided. In some embodiments of the present disclosure, the semiconductor substrate 101 may be made of a semiconductor material (such as, silicon (Si) or germanium (Germanium, Ge)) or made of a compound semiconductor material (such as, gallium arsenide (GaAs)). However, in other embodiments, the semiconductor substrate 101 may be a silicon-on-insulator (SOI) substrate. In another embodiment of the present disclosure, the semiconductor substrate 101 is preferably a silicon wafer. In the present embodiment, the semiconductor substrate 101 includes a semiconductor base layer 101a (for example, a silicon base layer) and a pad oxide layer 101b formed on the semiconductor base layer 101a (see FIG. 2A).

Next, referring to step S12: A patterned mask layer 102 is formed on a surface 101s of the semiconductor substrate 101, wherein the patterned mask layer 102 includes a plurality of standing walls 102a and a plurality of covering parts 102b. In some embodiments, at least two adjacent ones of the plurality of standing walls 102a define a first opening 103 to expose a portion of the surface 101s of the semiconductor substrate 101. Each of the covering parts 102b of the patterned mask layer 102 blankets over the 101s of the semiconductor substrate 101, and forms a non-180° angle θ (for example, a 90° angle) with the standing walls 102a connected thereto.

The forming of the patterned mask layer 102 includes steps as follows: Firstly, referring to step S121: a patterned sacrificial layer 104 having a plurality of mandrel units 104a is formed on the surface 101s of the semiconductor substrate 101 (see FIG. 2B). In the present embodiment, the patterned sacrificial layer 104 is formed by a deposition process, such as physical vapor deposition (PVD) process, a chemical vapor deposition (CVD) process, a sputtering process, or other suitable manufacturing processes. An amorphous silicon (a-Si) layer is formed on the surface 101s of the substrate; then a portion of the amorphous silicon layer is removed by a dry etching process, such as a reactive ion etching (RIE) process to remain a plurality of three-dimensional amorphous silicon bumps on the surface 101s of the semiconductor substrate serving as a plurality of mandrel units 104a. Wherein, each of the mandrel units 104a has a substantially flat top surface 104t, and has a vertical cross-section of a wedge-shaped, rectangular, regular or irregular polygon.

Figure 2A:
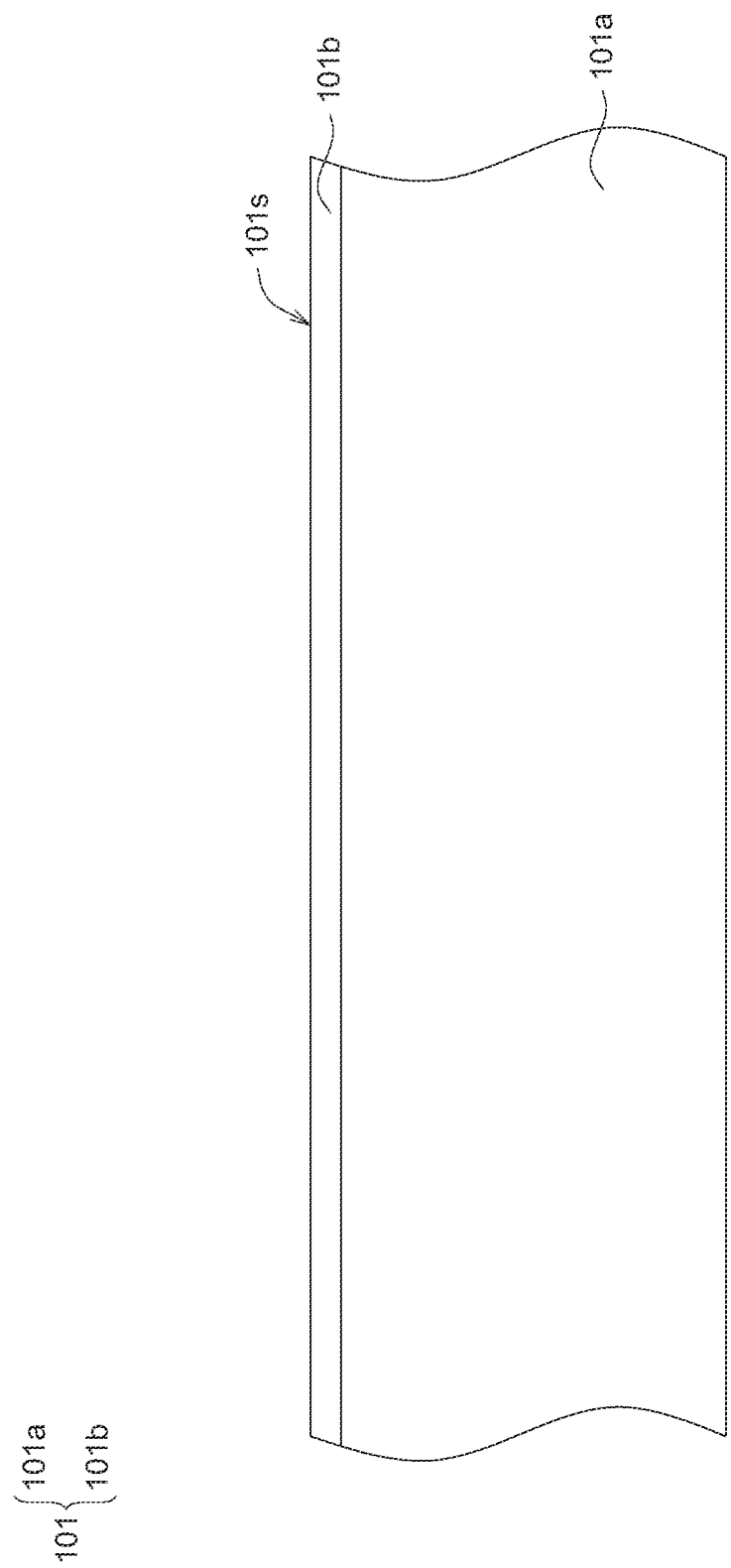
FIGS. 2A to 2L are cross-sectional views illustrating a series of processing structures for fabricating the semiconductor device according to the method as described in FIG. 1.
Figure 2B:
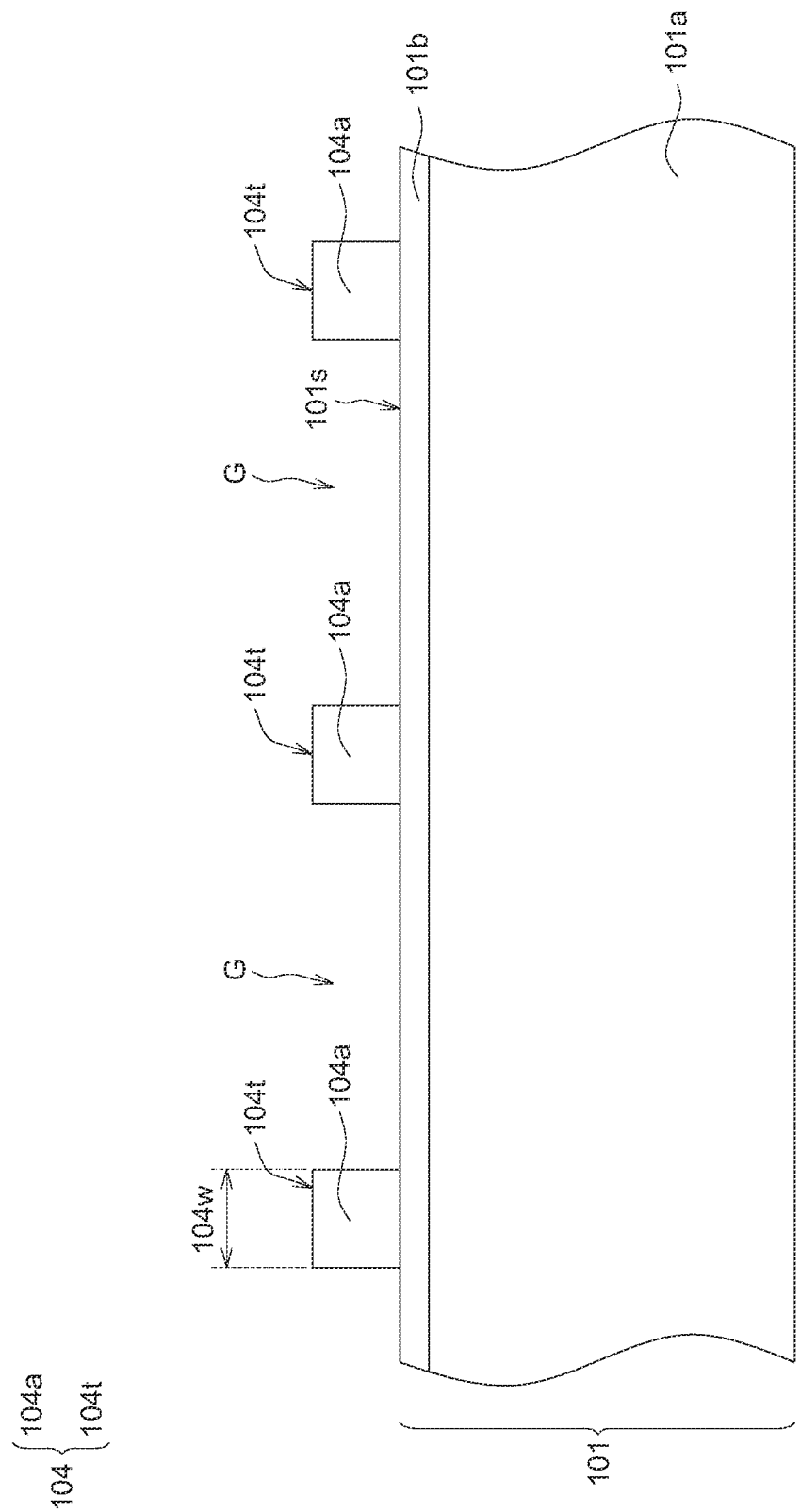
Figure 2C:
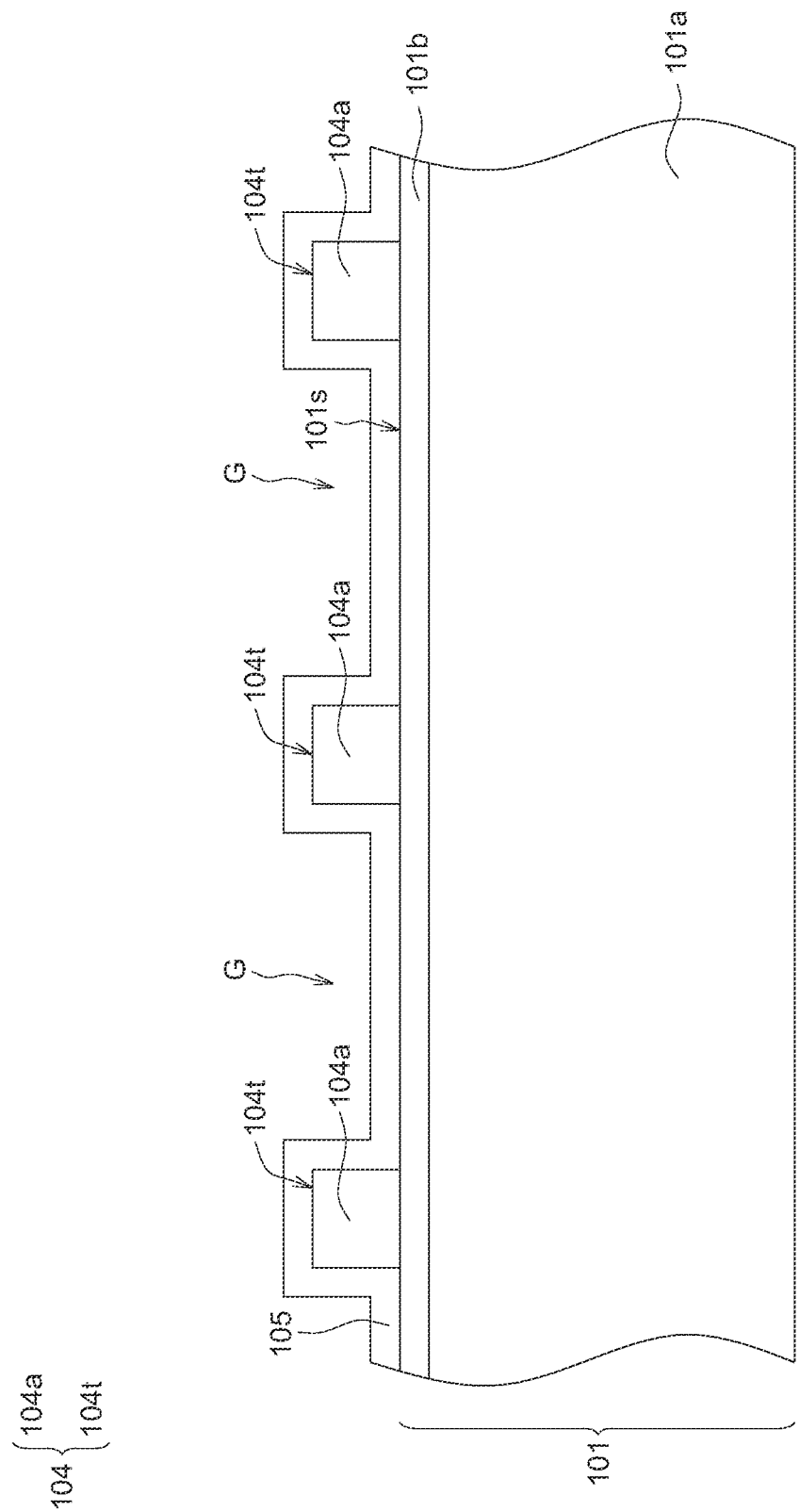
Figure 2D:
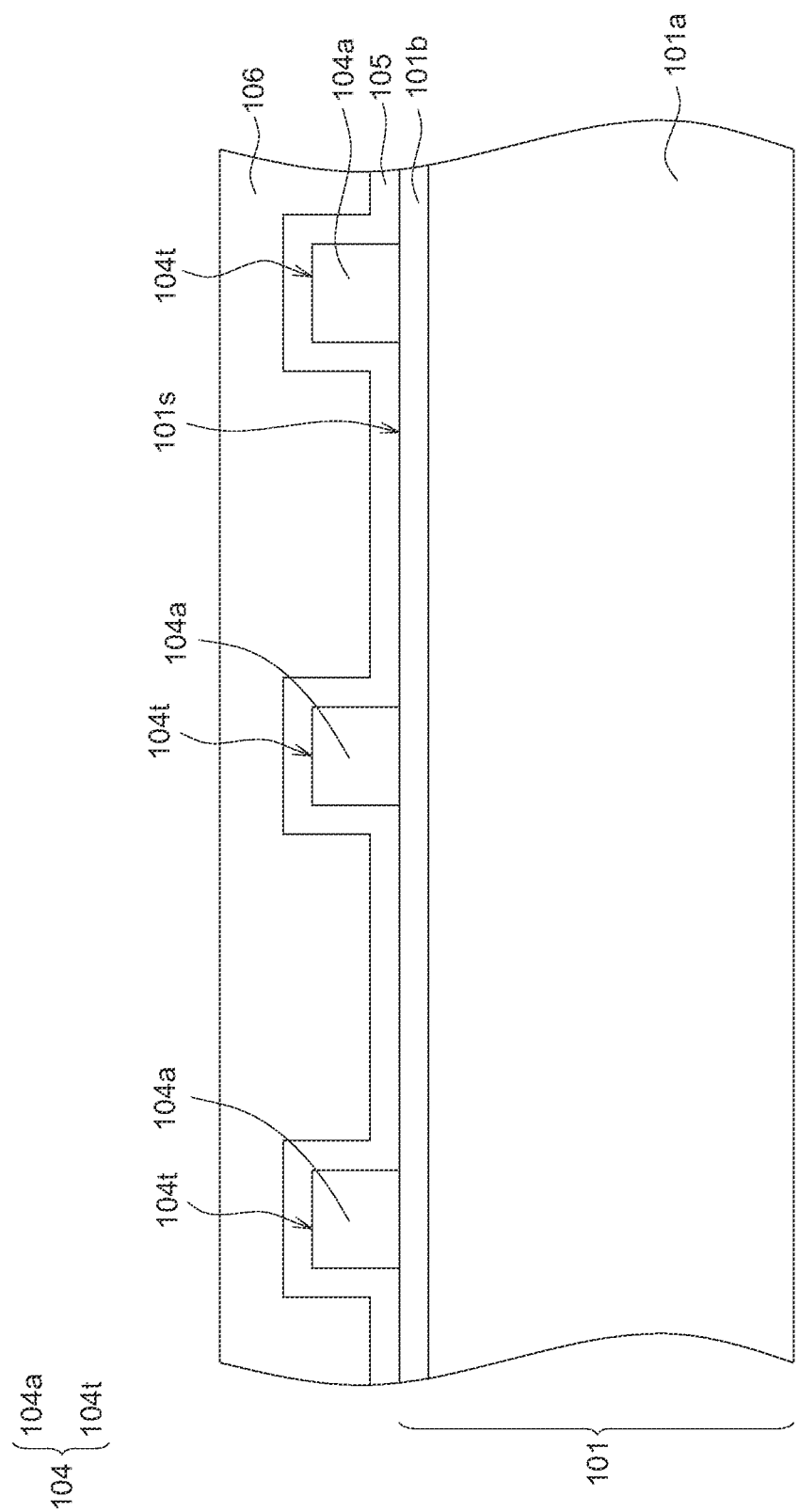

Then, referring to step S122, a blanket layer 105 is formed to conformally cover these mandrel units 104a and the portions of the surface 101s of the semiconductor substrate that are not covered by the mandrel units 104a (see FIG. 2C). In some embodiments of the present disclosure, the blanket layer 105 may include silicon nitride. In the present embodiment, since the thickness of the blanket layer 105 is less than the height of the mandrel units 104a, thus it cannot fill the gaps G between two adjacent ones of the mandrel units 104a.

Thereafter, referring to step S123: a portion of the blanket layer 105 is removed to expose the top surfaces 104t of the mandrel units 104a. In some embodiments of the present disclosure, a clapping layer 106 can be firstly formed on the blanket layer 105 to cover the blanket layer 105 and completely fill the gaps G between two adjacent ones of the plurality of mandrel units 104a, prior to the step of removing a portion of the blanket layer 105 (see FIG. 2D). In the present embodiment, the clapping layer 106 can be a photoresist coating.

Figure 2E:
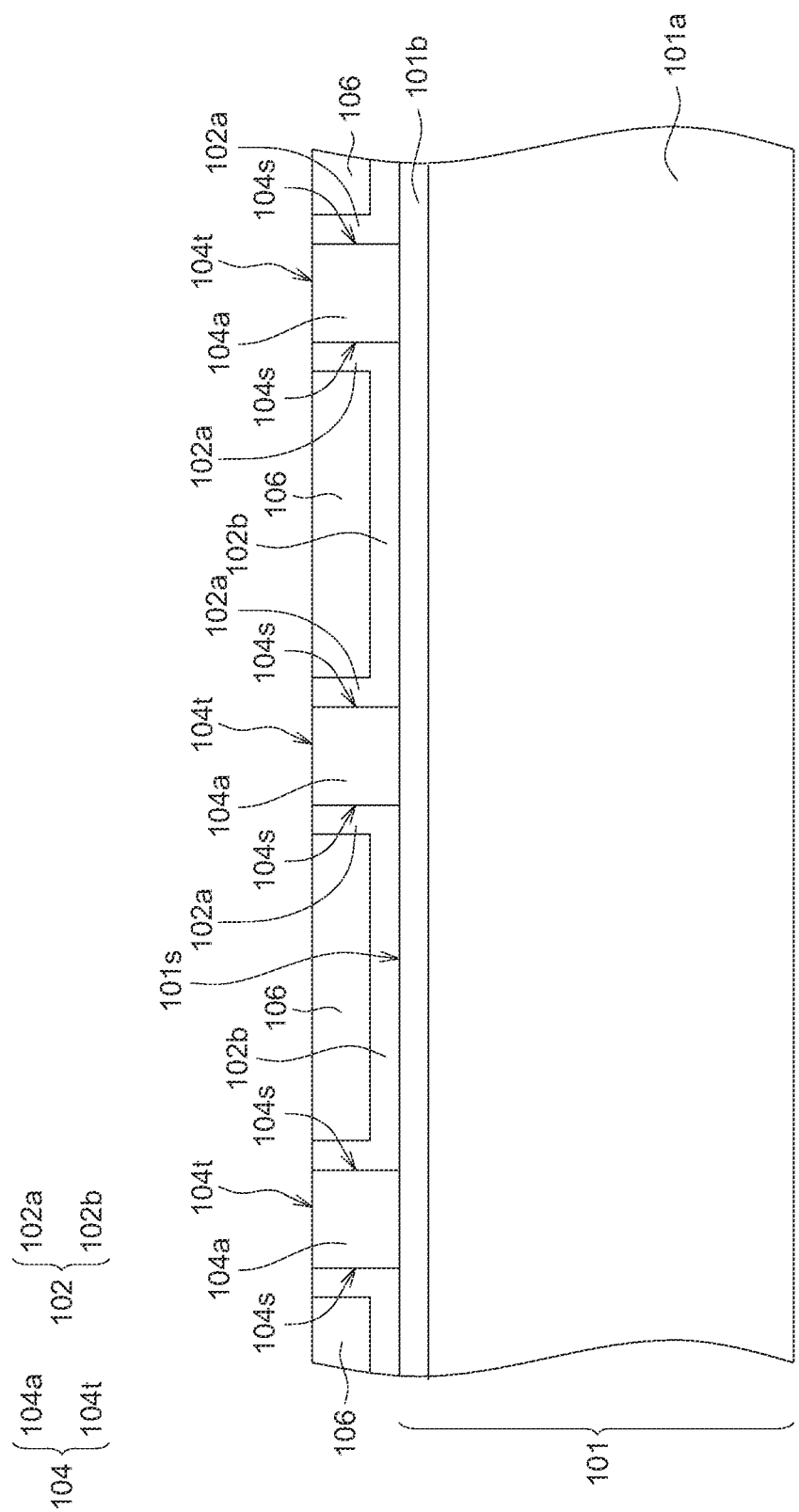

The step of removing a portion of the blanket layer 105 may include performing an etch-back process on the blanket layer 105 (the clapping layer 106), removing the portion of the blanket layer 105 disposed on the top surfaces 104t of the mandrel units 104a, so as to exposed the top surfaces 104t of the mandrel units 104a (see FIG. 2E).

However, the step of removing the portion of the blanket layer 105 may not be limited to this regard. In some other embodiments of the present disclosure, the step of removing the portion of the blanket layer 105 may include performing a planarization process, such as a chemical mechanical polishing (CMP) process, on the clapping layer 106 and the blanket layer 105 and stopping at the top surfaces 104t of the mandrel units 104a.

After removing the remaining clapping layer 106, the remaining portion of the blanket layer 105 constitutes the plurality of standing walls 102a and the plurality of covering parts 102b of the patterned mask layer 102. Wherein, each of the standing walls 102a of the patterned mask layer 102 is respectively located on at least one side wall 104s of the mandrel units 104a. The covering parts 102b of the patterned mask layer 102 cover the portion of the surface 101s of the semiconductor substrate 101 that is not covered by the mandrel units 104a.

However, it should be appreciated that the material and steps for forming the patterned mask layer 102 may not be limited these regards. In other embodiments, any material layer that is formed of different from the semiconductor substrate 101, that is available for forming a 3D pattern on the surface 101s of the semiconductor substrate 101, and that can be removed therefrom in the subsequent manufacturing process is not separated from the spirit of the patterned mask layer 102 as described here.

Figure 2F:
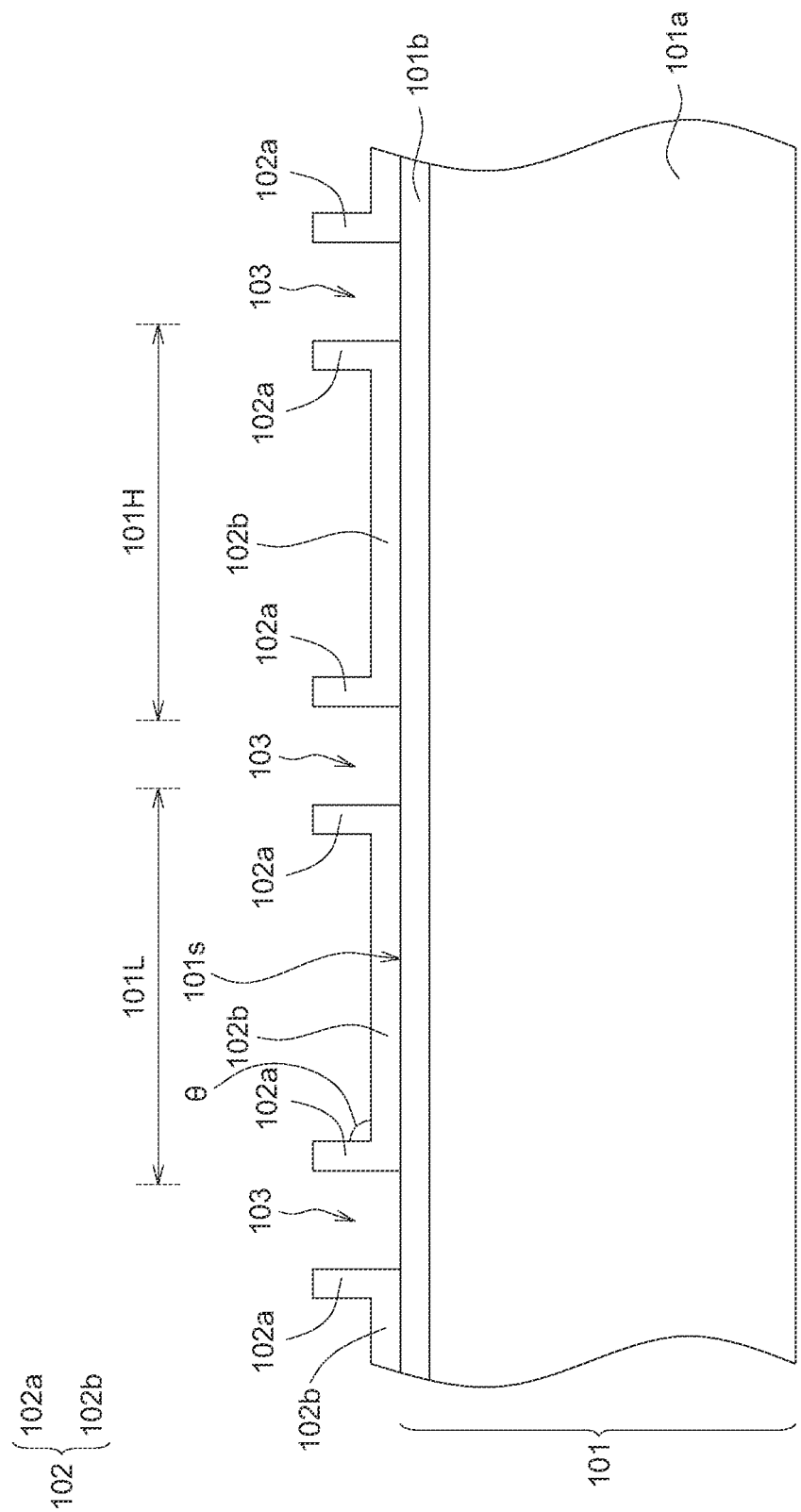
Figure 2G:
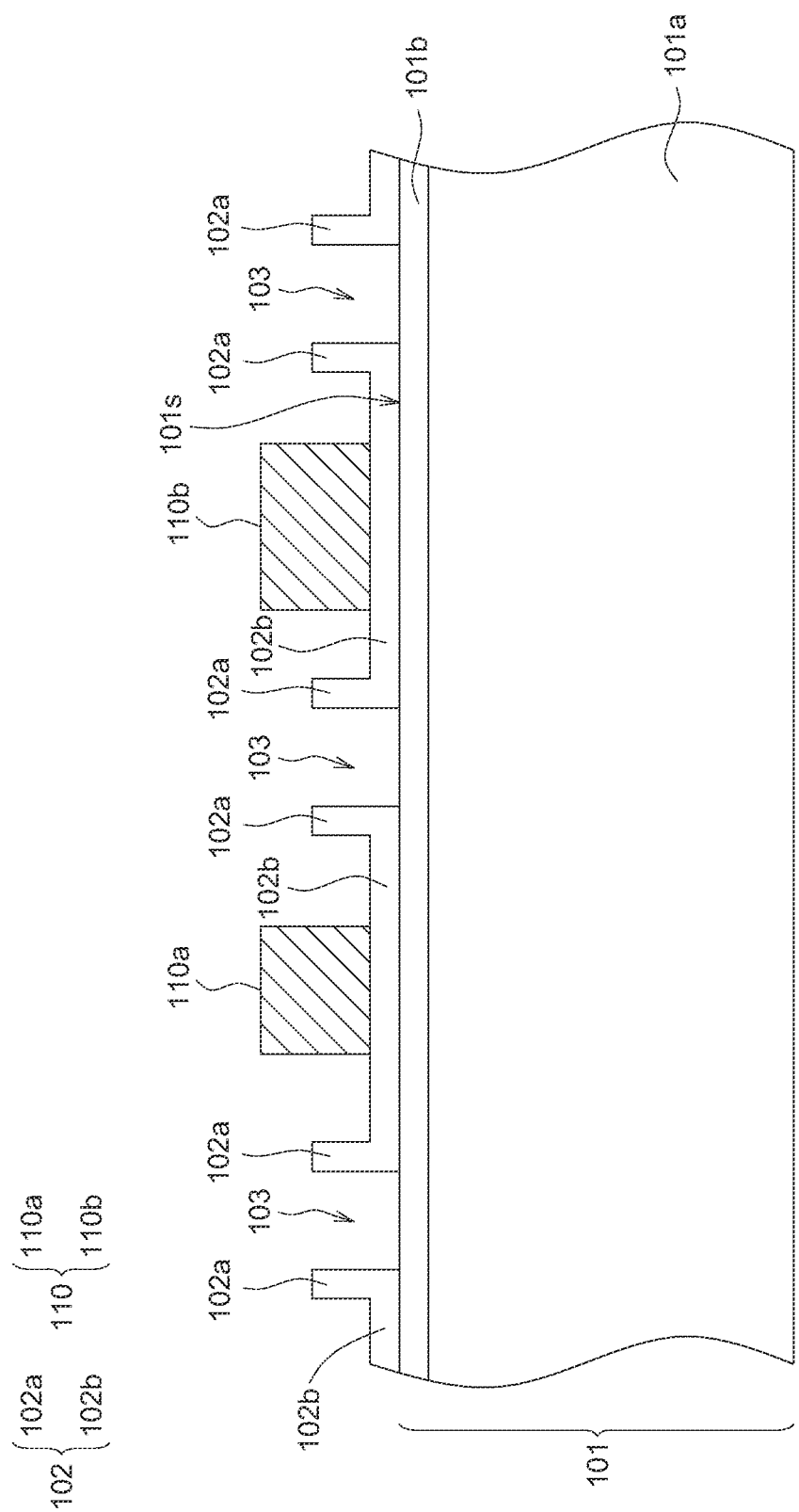

Referring to step S124: the patterned sacrificial layer 104 including the mandrel units 104a is then removed, and a plurality of first openings 103 are form at the positions originally occupied by the mandrel units 104a to expose portions of the surface 101s of the semiconductor substrate 101 (see FIG. 2F).

Referring to step S13: a first patterned photoresist layer 110 is formed to partially cover the covering parts 102b of the patterned mask layer 102. In some embodiments of the present disclosure, the first patterned photoresist layer 110 includes a plurality of photoresist bumps 110a and a plurality of photoresist bumps 110b, respectively covering the covering parts 102b located above the high-voltage region 101H and the covering parts 102b located above the low-voltage region 101L (see FIG. 2G).

Referring to step S14: a first etching process 108 is performed to form at least one first trench 109 in the semiconductor substrate 101, passing through the semiconductor substrate 101 and aligning with the first openings 103. In some embodiments of the present disclosure, the first etching process 108 can be a dry etching process, such as a RIE process, using a combination of the patterned mask layer 102 and the first patterned photoresist layer 110 as the etching mask. A portion of the semiconductor substrate 101 can be removed through the first opening 103 by the first etching process 108 to form a plurality of first trenches 109 in the semiconductor substrate 101, whereby the surface 101s of the semiconductor substrate 101 can be at least divided into a high-voltage region 101H and a low-voltage region 101L.

Figure 2H:
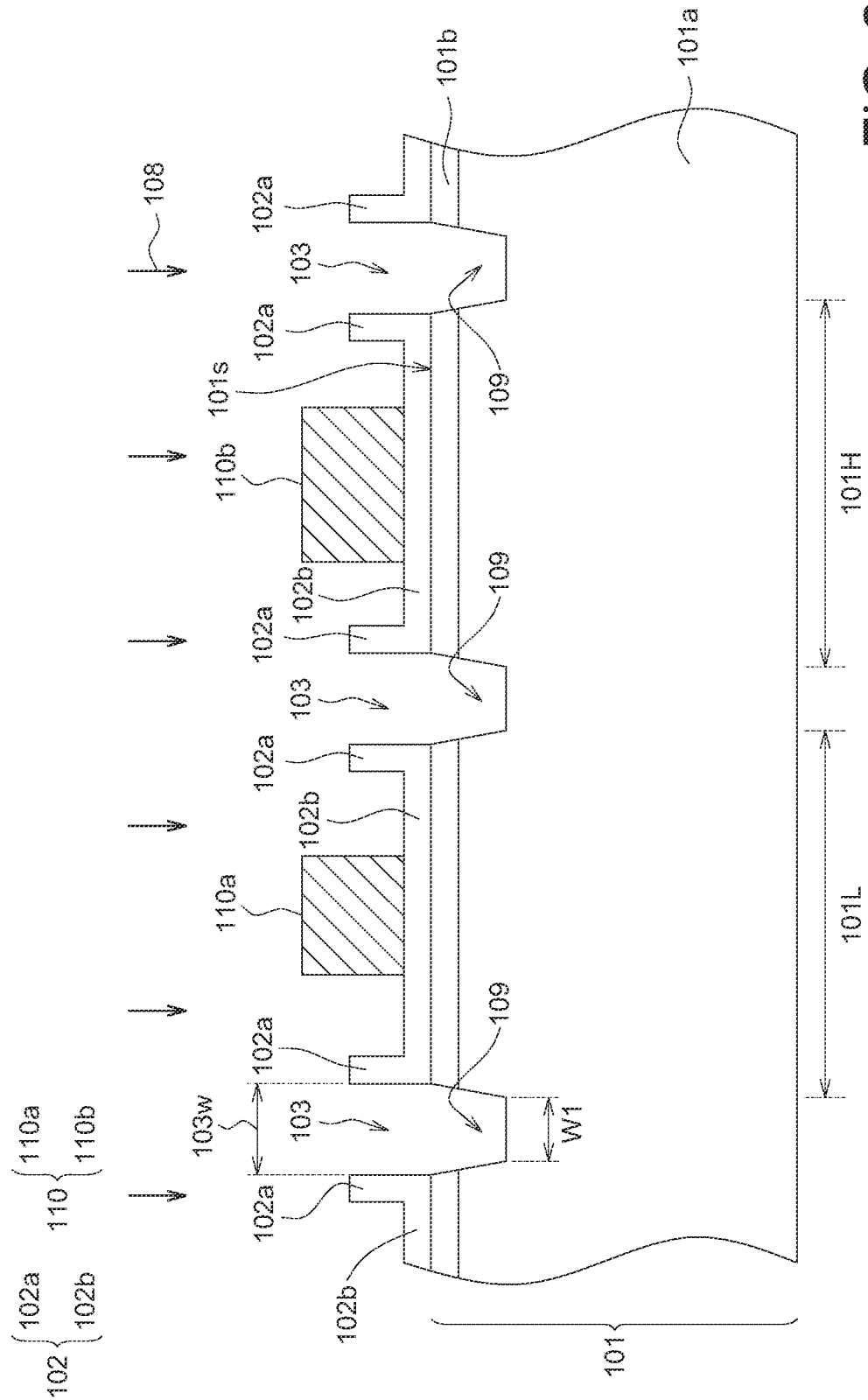
Figure 2I:
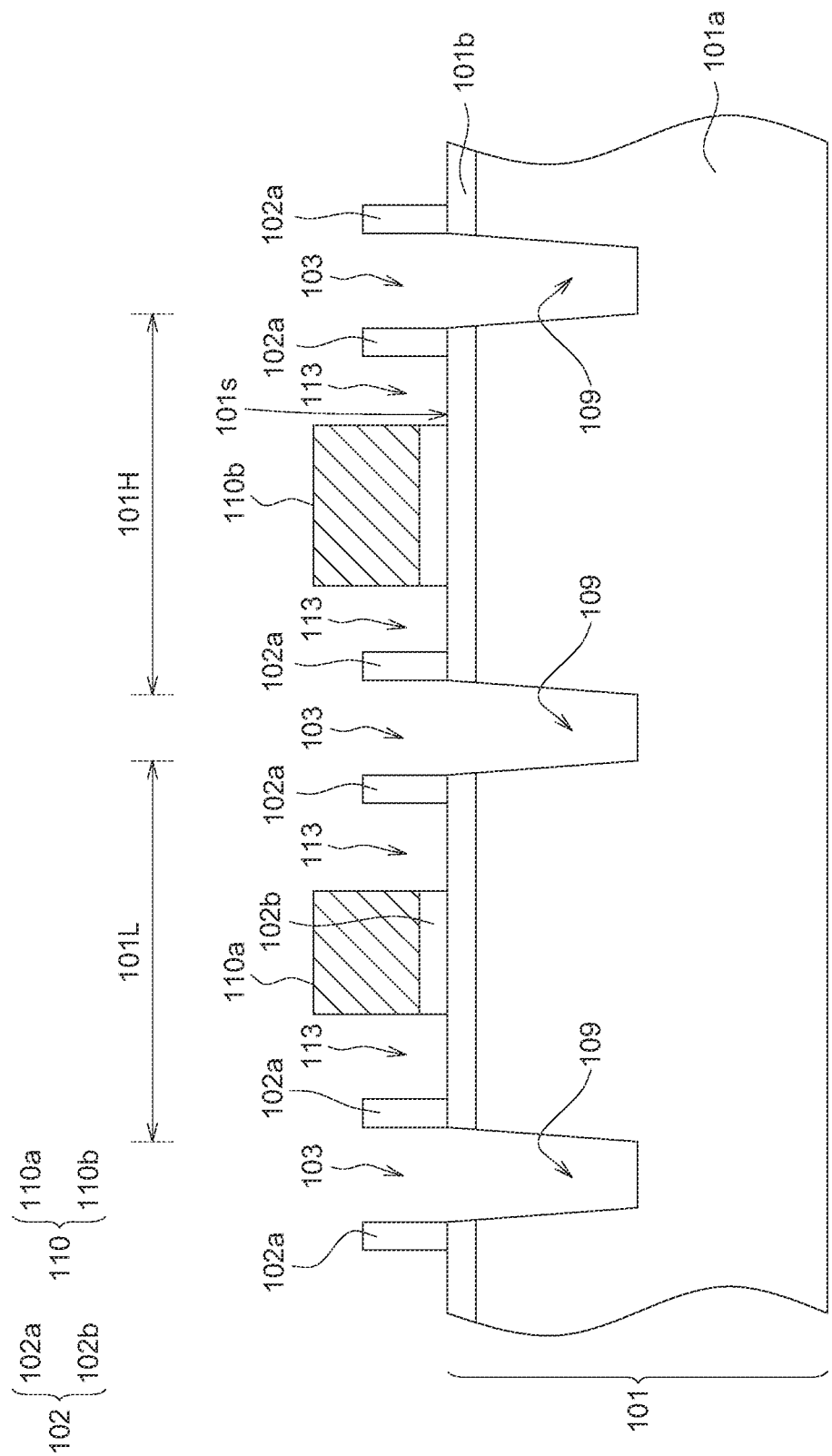

As shown in FIG. 2H, each of the plurality of first trenches 109 aligns with one of the first openings 103, and the opening width W1 of each first trench 109 is substantially equal to the opening width 103w of the corresponding first opening 103. Since the first openings 103 are formed by removing the mandrel units 104a, thus the opening width W1 of each first trenches 109 is substantially equal to the width 104w of the corresponding mandrel unit 104a (see FIG. 2B).

Referring to step S15: a portion of the patterned mask layer 102 is removed to form at least one second opening 113 exposing another portion of the surface 101s of the semiconductor substrate 101. Wherein, the at least one second opening 113 is defined by at least one of the standing walls 102a and a remaining portion of the covering parts 102b that is covered by the first patterned photoresist layer 110.

In some embodiments of the present disclosure, the step of removing a portion of the patterned mask layer 102 to form the second opening 113 includes using the first patterned photoresist layer 110 as an etching mask, and performing a dry etching process to remove the portion of the covering parts 102b not covered by the first patterned photoresist layer 110. And while removing the portion of the patterned mask layer 102 (the covering parts 102b), another portion of the semiconductor substrate 101 can be further removed through the first openings 103 to deepen the first trenches 109 (see FIG. 2H).

Referring to step S16: a second etching process 118 is performed to form at least one second trench 119 in the semiconductor substrate 101 aligning the second opening 113 and to define active areas 120a and 120b respectively on the high-voltage region 101H and the low-voltage region 101L of the surface 101s of the semiconductor substrate 101, wherein the depth D1 of the first trenches 109 is greater than the depth D2 of the second trench 119.

In some embodiments of the present disclosure, the second etching process 118 can be a dry etching process, such as a RIE process, using a combination of the remaining patterned mask layer 102 and the first patterned photoresist layer 110 as the etching mask. A portion of the semiconductor substrate 101 can be removed through a plurality of the second openings 113 by the second etching process 118 to form a plurality of second trenches 119 respectively in the high-voltage region 101H and the low-voltage region 101L, meanwhile yet another portion of the semiconductor substrate 101 can be removed through the first opening 103 to deepen the first trench 109 again.

Figure 2J:
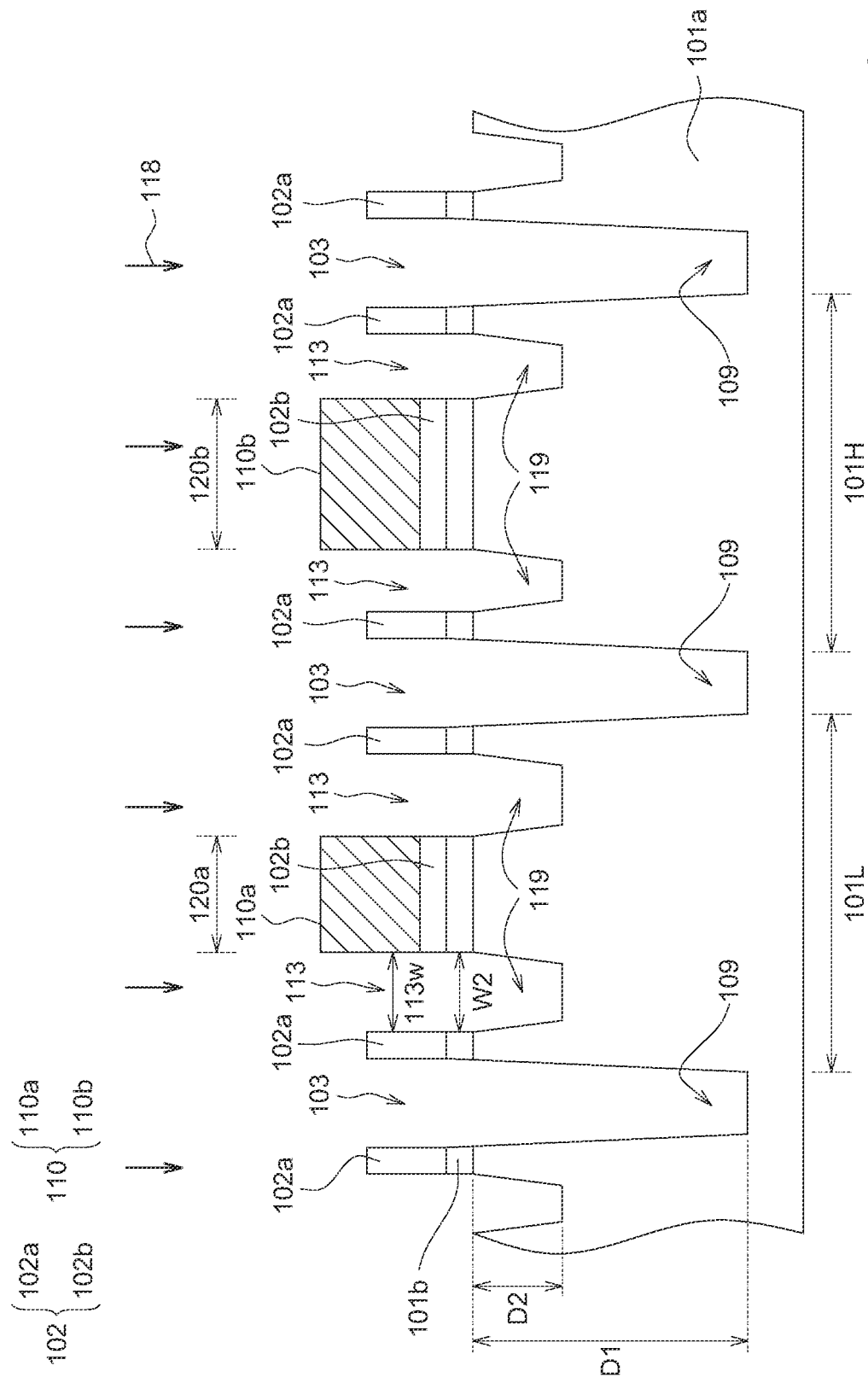

As shown in FIG. 2J, each of the second trenches 119 aligns with one of the second openings 113, and the opening width W2 of the second trenches 119 is substantially equal to the opening width 113w of the corresponding second opening 113. The active regions 120a and 120b respectively aligns with the photoresist bumps 110a and 110b of the first patterned photoresist layer 110, and are surrounded by one of the second trenches 119.

Figure 2K:
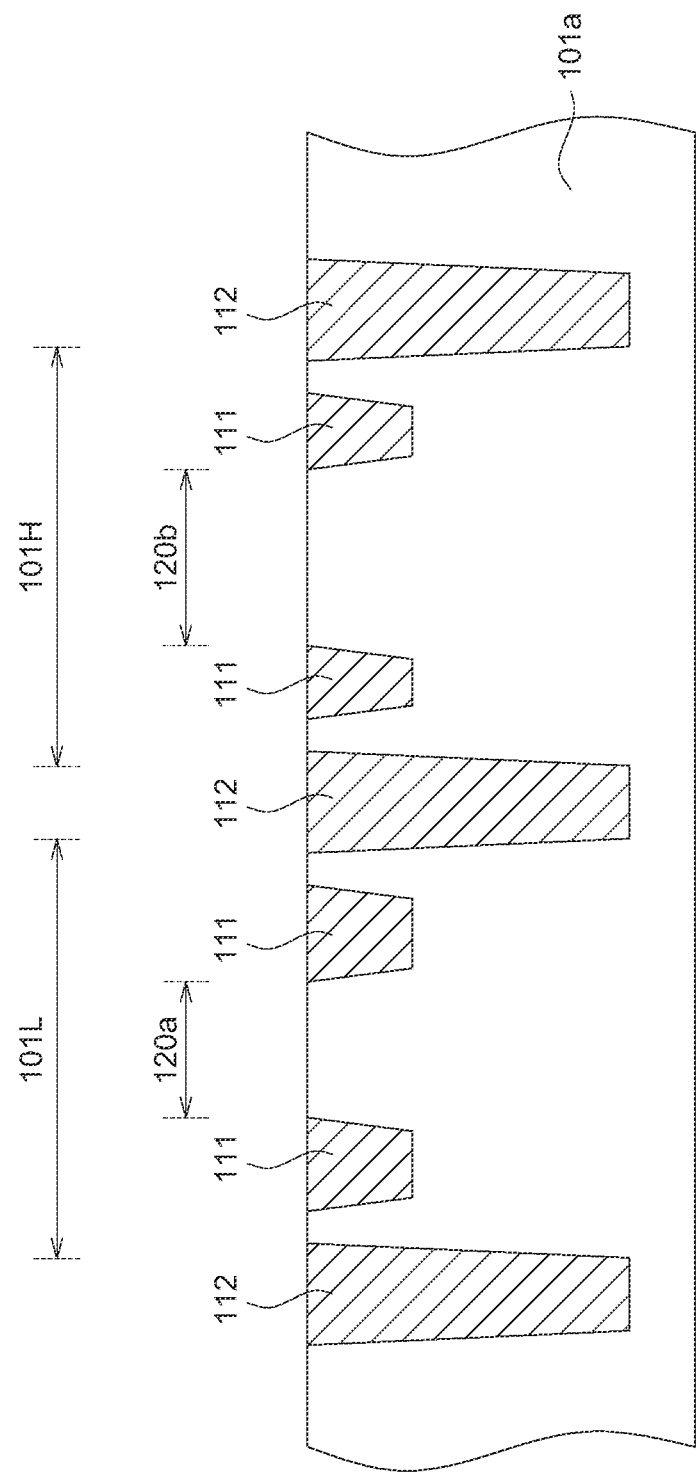

After removing the remaining patterned mask layer 102 and the first patterned photoresist layer 110, referring to step S17: a deep trench isolation structure 111 and a shallow trench isolation structure 112 are respectively formed in each of the first trenches 109 and each of the second trenches 119 (see FIG. 2K).

In some embodiments of the present disclosure, the forming of the deep trench isolation structure 111 and the shallow trench isolation structure 112 includes steps of filling the first trenches 109 and the second trenches 119 with a dielectric material, such as silicon oxide, silicon nitride, silicon oxy-carbide; and performing a planarization process, for example, a chemical mechanical polishing (CMP) process, using the surface 101s of the semiconductor substrate 101 as a stop layer to remove the pad silicon oxide layer 101b and the portions of the dielectric material disposed above the semiconductor base layer 101a.

Figure 2L:
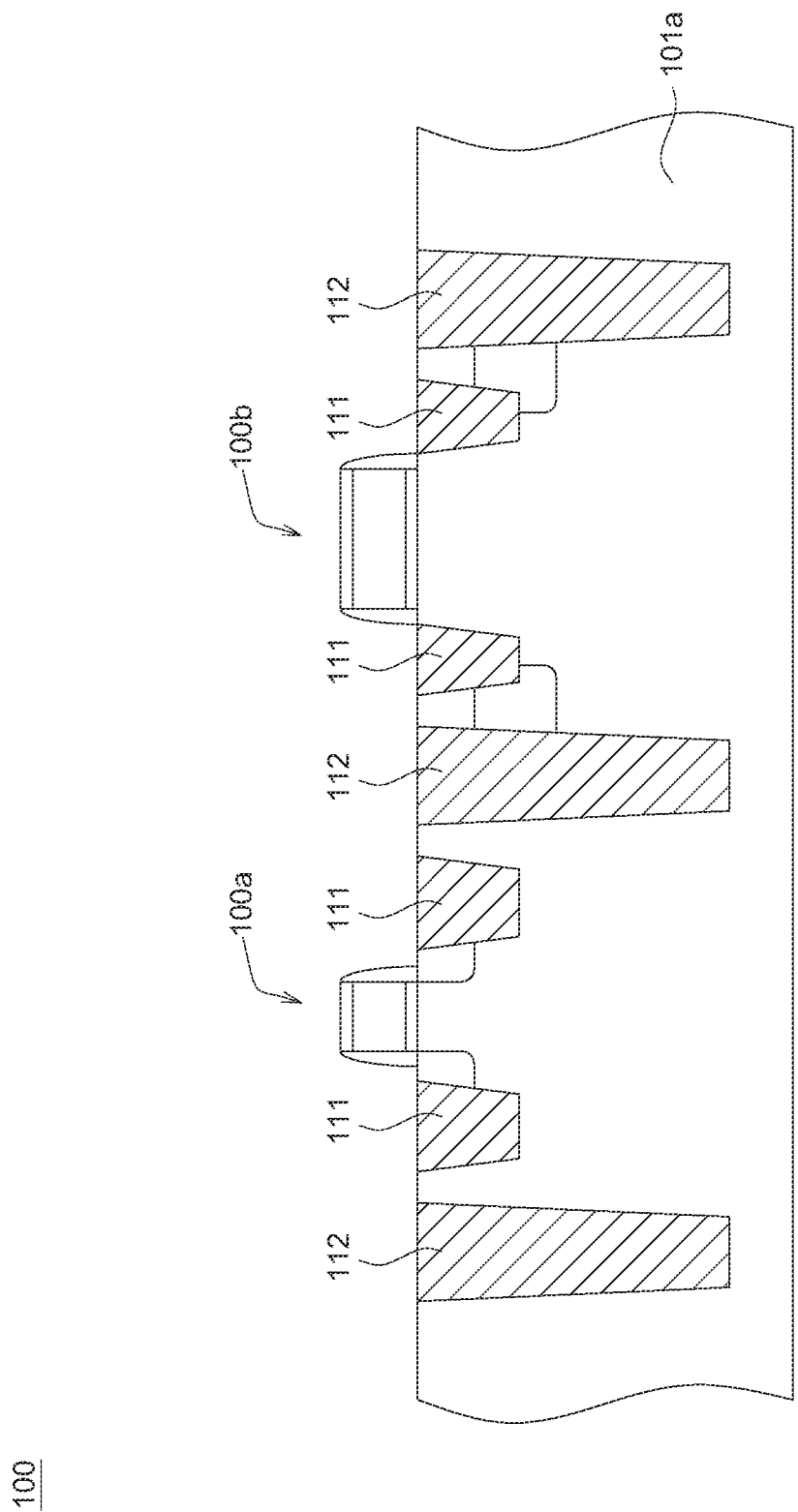

Subsequently, referring to step S18, a logic element unit 100b and a high voltage element unit 100a are formed in the active regions 120a and 120b of the low voltage region 101L and the high voltage region 101H above the semiconductor base layer 101a, respectively (see FIG. 2L). And after a series of downstream processes are performed, the preparation of the semiconductor device 100 is completed.

In accordance with the aforementioned embodiments of the present disclosure, a method for fabricating a semiconductor device 100 is provided. A patterned sacrificial layer 104 having at least one mandrel unit 104a is used to form a patterned mask layer 102 with a three-dimensional (3D) opening structure (e.g. at least one of the first openings 103) on the surface 101s of a semiconductor substrate 101. An etching process (i.e. the first etching process 108) using the patterned mask layer 102 as an etching mask is then performed to etch the surface 101s of the semiconductor substrate 101. Thereafter, another photoresist photolithography (e.g. the first patterned photoresist layer 110) etching process (i.e. the second etching process 118) is performed thereon to form two types of self-aligned trench structures (e.g. the first trenches 109 and the second trenches 119) with different depths in the semiconductor substrate 101, and at least one active region (e.g. the active regions 120a and 120b) can be defined on the surface 101s of the semiconductor substrate 101 for subsequently forming semiconductor units (e.g. the logic element unit 100b and the high voltage element unit 100a) thereon. Thereby, the processing steps and complexity for forming the semiconductor device 100 can be greatly reduced, and the yield and efficiency for manufacturing the same can be significantly improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a semiconductor device, comprising:
    forming a patterned mask layer including a plurality of standing walls and at least one covering part on a surface of a semiconductor substrate, wherein at least two adjacent ones of the plurality of standing walls define at least one first opening exposing a portion of the surface, and the at least one covering part blankets over the surface;
    forming a first patterned photoresist layer to at least partially cover the at least one covering part;
    performing a first etching process, using a combination of the patterned mask layer and the first patterned photoresist layer as an etching mask, to form at least one first trench in the substrate, passing through the surface and aligning with the at least one first opening;
    removing a portion of the patterned mask layer to form at least one second opening exposing another portion of the surface;
    performing a second etching process, using a combination of a remaining portion of the patterned mask layer and the first patterned photoresist layer as an etching mask, to form at least one second trench in the semiconductor substrate and define an active area on the surface, wherein the at least one first trench has a depth greater than that of the at least one second trench.

2. The method according to claim 1, wherein forming the first patterned photoresist layer comprises:
    forming a patterned sacrificial layer having at least one mandrel unit on the surface;

forming a blanket layer conformally covering the at least one mandrel unit and a portion of the surface that is not covered by the at least one mandrel unit;

removing a portion of the blanket layer to expose a top surface of the at least one mandrel unit, to make a remaining portion of the blanket layer constitutes the plurality of standing walls and the at least one covering part, wherein each of the standing walls is respectively located on at least one side wall of the at least one mandrel unit, and the at least one covering part covers the portion of the surface; and removing the patterned sacrificial layer.

3. The method according to claim 2, wherein the at least one mandrel unit has a width substantially equal to an opening width of the at least one first trench.

4. The method according to claim 2, wherein the patterned sacrificial layer comprises amorphous silicon (a-Si); and the blanket layer comprises silicon nitride.

5. The method according to claim 2, further comprising forming a clapping layer covering the blanket layer, prior to the step of removing a portion of the blanket layer.

6. The method according to claim 5, wherein the clapping layer is a photoresist coating; and the step of removing a portion of the blanket layer comprises performing an etch-back process on the blanket layer.

7. The method according to claim 5, wherein the step of removing a portion of the blanket layer comprises performing a planarization process on the clapping layer and the blanket layer and stopping at the top surface of the at least one mandrel unit.

8. The method according to claim 5, wherein the at least one second trench is defined by a remaining portion of the at least one covering part and at least one of the plurality of standing walls; and the at least one second trench aligns the at least one second opening.

9. The method according to claim 1, wherein the semiconductor substrate comprises:
 a semiconductor base layer; and
 a pad oxide layer formed on the semiconductor base layer.

10. The method according to claim 1, wherein the at least one covering part form a non-180° angle with one of the plurality of standing walls.

* * * * *